(12) United States Patent
Wang et al.

(10) Patent No.: US 9,153,620 B2
(45) Date of Patent: Oct. 6, 2015

(54) METHOD OF FABRICATING A METAL GRID FOR SEMICONDUCTOR DEVICE

(71) Applicant: Taiwan Semiconductor Manufacturing Company, Ltd., Hsin-Chu (TW)

(72) Inventors: Chih-Chien Wang, Changhua County (TW); Chihy-Yuan Cheng, Tainan (TW); Chuan-Ling Wu, Changhua County (TW); Chun-Chang Chen, Tainan (TW); Wang-Pen Mo, Pingtung County (TW); Feng-Jia Shiu, Hsinchu County (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 31 days.

(21) Appl. No.: 14/194,859

(22) Filed: Mar. 3, 2014

(65) Prior Publication Data

US 2015/0249109 A1    Sep. 3, 2015

(51) Int. Cl.
*H01L 21/20* (2006.01)
*H01L 27/146* (2006.01)

(52) U.S. Cl.
CPC .... *H01L 27/14685* (2013.01); *H01L 27/14621* (2013.01); *H01L 27/14625* (2013.01); *H01L 27/14627* (2013.01); *H01L 27/14636* (2013.01); *H01L 27/14645* (2013.01); *H01L 27/14689* (2013.01)

(58) Field of Classification Search
None
See application file for complete search history.

(56) References Cited

U.S. PATENT DOCUMENTS

| | | | |
|---|---|---|---|
| 2010/0181283 A1* | 7/2010 | Chuang et al. | 216/13 |
| 2012/0193741 A1* | 8/2012 | Borthakur et al. | 257/433 |
| 2013/0270667 A1* | 10/2013 | Wang et al. | 257/443 |
| 2014/0263956 A1* | 9/2014 | Jian et al. | 250/208.1 |
| 2014/0339606 A1* | 11/2014 | Lin et al. | 257/228 |
| 2015/0048467 A1* | 2/2015 | Weng et al. | 257/432 |
| 2015/0087102 A1* | 3/2015 | JangJian et al. | 438/65 |
| 2015/0087104 A1* | 3/2015 | Tseng et al. | 438/70 |
| 2015/0140741 A1* | 5/2015 | Sze et al. | 438/65 |
| 2015/0145083 A1* | 5/2015 | Chou et al. | 438/65 |

\* cited by examiner

*Primary Examiner* — Alexander Ghyka
(74) *Attorney, Agent, or Firm* — Haynes and Boone, LLP (57) ABSTRACT

A method for manufacturing the image sensor device is provided. The method includes depositing a first dielectric layer over a back surface of a substrate, forming a ridge over the first dielectric layer, depositing a second dielectric layer over the first dielectric layer, including filling in a space between two adjacent ridges. The method also includes removing the ridge to form a trench in the second dielectric layer and forming a metal grid in the trench.

20 Claims, 13 Drawing Sheets

METHOD OF FABRICATING A METAL GRID FOR SEMICONDUCTOR DEVICE

BACKGROUND

Integrated circuit (IC) technologies are constantly being improved. Such improvements frequently involve scaling down device geometries to achieve lower fabrication costs, higher device integration density, higher speeds, and better performance. Along with the advantages realized from reducing geometry size, improvements are being made directly to the IC devices. One such IC device is an image sensor device. An image sensor device includes a pixel array for detecting light and recording intensity (brightness) of the detected light. The pixel array responds to the light by accumulating a charge—the more light, the higher the charge. The charge can then be used (for example, by other circuitry) to provide a color and brightness that can be used for a suitable application, such as a digital camera. Common types of pixel grids include a charge-coupled device (CCD) image sensor or complimentary metal-oxide-semiconductor (CMOS) image sensor device.

One type of image sensor device is a backside illuminated image sensor (BSI) device. BSI devices are used for sensing a volume of light projected towards a backside surface of a substrate (which supports the image sensor circuitry of the BSI device). The pixel array is located at a front side of the substrate and the substrate is thin enough so that light projected towards the backside of the substrate can reach the pixel array. BSI devices provide a high fill factor and reduced destructive interference, as compared to front-side illuminated (FSI) image sensor devices. However, due to device scaling, improvements to BSI technology are continually being made to further improve BSI device quantum efficiency. Accordingly, although existing BSI devices and methods of fabricating these BSI devices have been generally adequate for their intended purposes, as device scaling down continues, they have not been entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1:
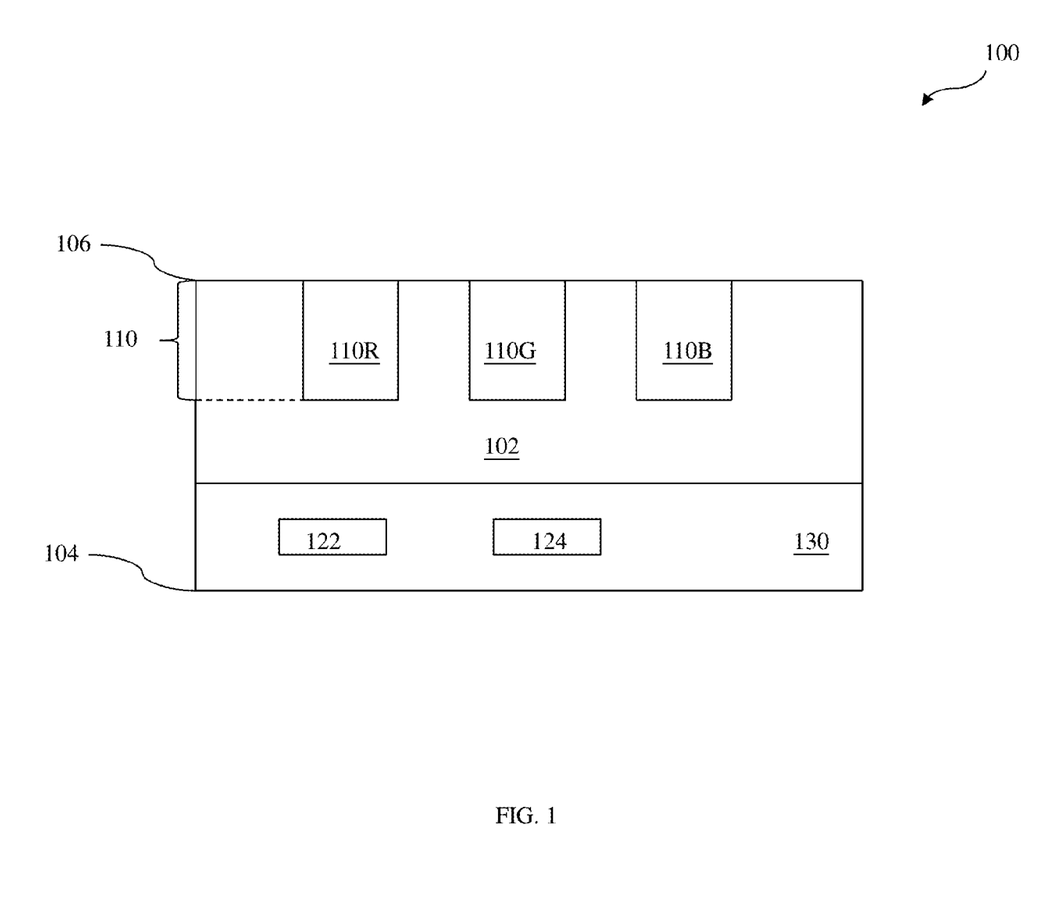
FIG. 1 is a diagrammatic sectional side view of an integrated circuit (IC) device precursor in accordance with some embodiments.

FIG. 1 is a diagrammatic sectional side view, in portion, of an integrated circuit (IC) device precursor in accordance with some embodiments. An example IC device precursor 100 may be an IC chip, system on chip (SoC), or portion thereof, that includes various passive and active microelectronic components, such as resistors, capacitors, inductors, diodes, metal-oxide-semiconductor field effect transistors (MOSFET), complementary MOS (CMOS) transistors, bipolar junction transistors (BJT), laterally diffused MOS (LDMOS) transistors, high power MOS transistors, fin-like field effect transistors (FinFET), other suitable components, or combinations thereof.

The IC device precursor 100 may include a first semiconductor wafer stacked on top of a second semiconductor wafer. For example, the first semiconductor wafer is an image sensor, such as a backside illuminated image sensor (BSI), a complementary metal-oxide-semiconductor (CMOS) image sensor (CIS), a charge-coupled device (CCD), an active-pixel sensor (APS), or a passive-pixel sensor. An image sensor may be fabricated by complementary metal-oxide semiconductor (CMOS) process techniques known in the art. For example, a p-type photo active region and an n-type photo active region are formed over a substrate of the image sensor wafer to form a PN junction, which functions as a photodiode. The image sensor may include a transistor to generate a signal related to the intensity or brightness of light that impinges on the photo active region. The second semiconductor wafer may be an application-specific integrated circuit (ASIC) wafer, or a carrier wafer.

The first and second semiconductor wafers may be bonded together through suitable bonding techniques such as direct bonding. In accordance with some embodiments, in a direct bonding process, the connection between the first and second semiconductor wafers can be implemented through metal-to-metal bonding (e.g., copper-to-copper bonding), dielectric-to-dielectric bonding (e.g., oxide-to-oxide bonding), metal-to-dielectric bonding (e.g., copper-to-oxide bonding), or any combination thereof. In some embodiments, the first and second semiconductor wafers are connected to each other through suitable three-dimensional structure. An adhesion layer may also be used. Additionally, a thinning process may be performed to thin either or both semiconductor wafers from the back surface. The thinning process may include a mechanical grinding process and/or a chemical thinning process.

The IC device precursor 100 includes a substrate 102 having a front surface 104 and a back surface 106 (an upsidedown position is shown in FIG. 1). In some embodiments, the substrate 102 includes an elementary semiconductor such as silicon or germanium and/or a compound semiconductor, such as silicon germanium, silicon carbide, gallium arsenic, indium arsenide, gallium nitride, and indium phosphide. Other exemplary substrate materials include alloy semiconductors, such as silicon germanium carbide, gallium arsenic phosphide, and gallium indium phosphide. The substrate 102 may also comprise non-semiconductor materials including soda-lime glass, fused silica, fused quartz, calcium fluoride ($CaF_2$), and/or other suitable materials. In some embodiments, the substrate 102 has one or more layers defined within it, such as an epitaxial layer. For example, the substrate 102 may include an epitaxial layer overlying a bulk semiconductor. Other layered substrates include semiconductor-on-insulator (SOI) substrates. In one such SOI substrate, the substrate 102 includes a buried oxide (BOX) layer formed by a process such as separation by implanted oxygen (SIMOX). In various embodiments, the substrate 102 may take the form of a planar substrate, a fin, a nanowire, and/or other forms known to one of skill in the art.

The substrate 102 may include one or more doped regions (not illustrated). In FIG. 1, the substrate 102 is doped with a p-type dopant. Suitable p-type dopants include boron, gallium, indium, other suitable p-type dopants, and/or combinations thereof. The substrate 102 may also include one or more regions doped with an n-type dopant such as phosphorus, arsenic, other suitable n-type dopants, and/or combinations thereof. Doping may be implemented using a process such as ion implantation or diffusion in various steps and techniques.

The substrate 102 may include isolation features (not illustrated), such as local oxidation of silicon (LOCOS) and/or shallow trench isolation (STI), to separate (or isolate) various regions and/or devices formed on or within the substrate 102. The isolation features include silicon oxide, silicon nitride, silicon oxynitride, other suitable materials, or combinations thereof. The isolation features are formed by any suitable process. For example, forming an STI includes a photolithography process, etching a trench in the substrate (for example, by using a dry etching and/or wet etching), and filling the trench (for example, by using a chemical vapor deposition process) with dielectric material. The filled trench may have a multi-layer structure, such as a thermal oxide liner layer filled with silicon nitride or silicon oxide.

As noted above, the IC device precursor 100 includes sensor elements 110 (also referred to as pixels). The sensor elements 110 detect intensity (brightness) of radiation 112 directed toward the back surface 106 of the substrate 102. In FIG. 1, the sensor elements 110 are configured to correspond with a specific light wavelength, such as a red (R), a green (G), or a blue (B) light wavelength. In other words, the sensor elements 110 are configured to detect intensity (brightness) of a particular light wavelength. In some embodiments, the sensor elements 110 are pixels in a pixel array.

In FIG. 1, the sensor elements 110 include a photodetector, such as a photodiode, that includes a light sensing region (or photo-sensing region) 110R, 110G, and 110B which detect intensity (brightness) of red, green, and blue light wavelengths, respectively. The light sensing regions (or photo-sensing regions) 110R, 110G, and 110B may include doped regions having n-type and/or p-type dopants formed in the substrate 102. In some embodiments, the light sensing regions 110R, 110G, and 110B are n-type doped regions, formed by a method such as diffusion and/or ion implantation. The sensor elements 110 further include various transistors, such as a transfer transistor (not illustrated), a reset transistor (not illustrated), a source-follower transistor (not illustrated), a select transistor (not illustrated), other suitable transistors, or combinations thereof. The light sensing regions 110R, 110G, and 110B and various transistors (which can collectively be referred to as pixel circuitry) allow the sensor elements 110 to detect intensity of the particular light wavelength. Additional circuitry, input, and/or outputs may be provided to the sensor elements 110 to provide an operation environment for the sensor elements 110 and/or support communication with the sensor elements 110.

The IC device precursor 100 further includes multilayer interconnect (MLI) features disposed over the front surface 104 of the substrate 102, including over the sensor elements 110. The MLI features are coupled to various components of the image sensor, such as the sensor elements 110, such that the various components of the image sensor are operable to properly respond to illuminated light (imaging radiation). The MLI features may include various conductive features, which may be vertical interconnects, such as contacts and/or vias 122, and/or horizontal interconnects, such as lines 124. The various conductive features 122 and 124 may include conductive materials, such as metals. In an example, metals include aluminum, aluminum/silicon/copper alloy, titanium, titanium nitride, tungsten, polysilicon, metal silicide, or combinations thereof.

Conductive features 122 and 124 may be formed by a process including physical vapor deposition (PVD), chemical vapor deposition (CVD), or combinations thereof. Other manufacturing techniques to form the various conductive features 122 and 124 may include photolithography processing and etching to pattern conductive materials to form the vertical and horizontal interconnects. Still other manufacturing processes may be implemented to form the conductive features, such as a thermal annealing to form metal silicide. The metal silicide used in the multilayer interconnects may include nickel silicide, cobalt silicide, tungsten silicide, tantalum silicide, titanium silicide, platinum silicide, erbium silicide, palladium silicide, or combinations thereof.

It is understood that the MLI features are not limited by the number, material, size, and/or dimension of the conductive features 122 and 124 depicted, and thus, the MLI features may include any number, material, size, and/or dimension of conductive features depending on design requirements of the integrated circuit device precursor 100.

The various conductive features 122 and 124 of the MLI features are disposed in an interlayer (or inter-level) dielectric (ILD) layer 130. The ILD layer 130 may include silicon dioxide, silicon nitride, silicon oxynitride, TEOS oxide, phosphosilicate glass (PSG), borophosphosilicate glass (BPSG), fluorinated silica glass (FSG), carbon doped silicon oxide, amorphous fluorinated carbon, Parylene, polyimide, other suitable material, and/or combinations thereof. Common methods for forming ILD layer 130 include thermal oxidation, chemical vapor deposition (CVD), high-density plasma CVD (HDP-CVD), physical vapor deposition (PVD), atomic layer deposition (ALD), spin-on deposition, and/or other suitable deposition processes. The ILD layer 130 may include multiple layers made by different dielectric materials.

Figure 2:
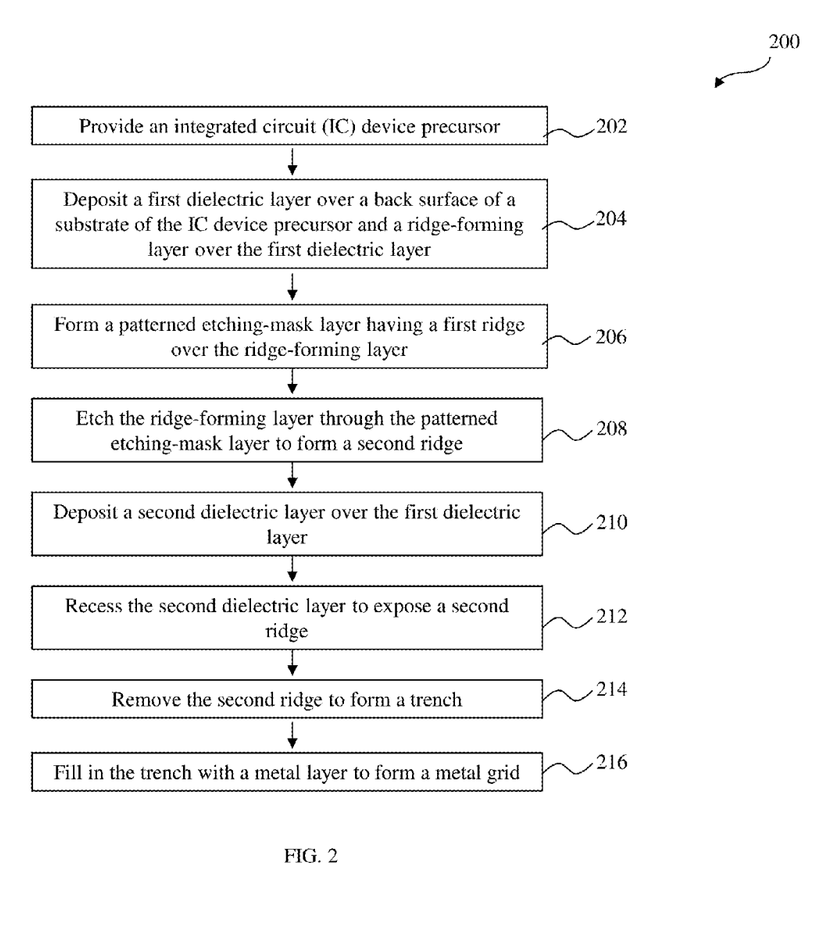
FIG. 2 is a flow chart of a method for fabricating an IC device in accordance with some embodiments.

FIG. 2 is a flowchart of a method 200 of forming a metal grid for an IC device according to various aspects of the present disclosure. FIGS. 3-11 are cross-sectional views of an example IC device 300 undergoing processes according to the method of FIG. 2. It is understood that additional steps can be provided before, during, and after the method, and some of the steps described can be replaced or eliminated for other embodiments of the method.

Figure 3:
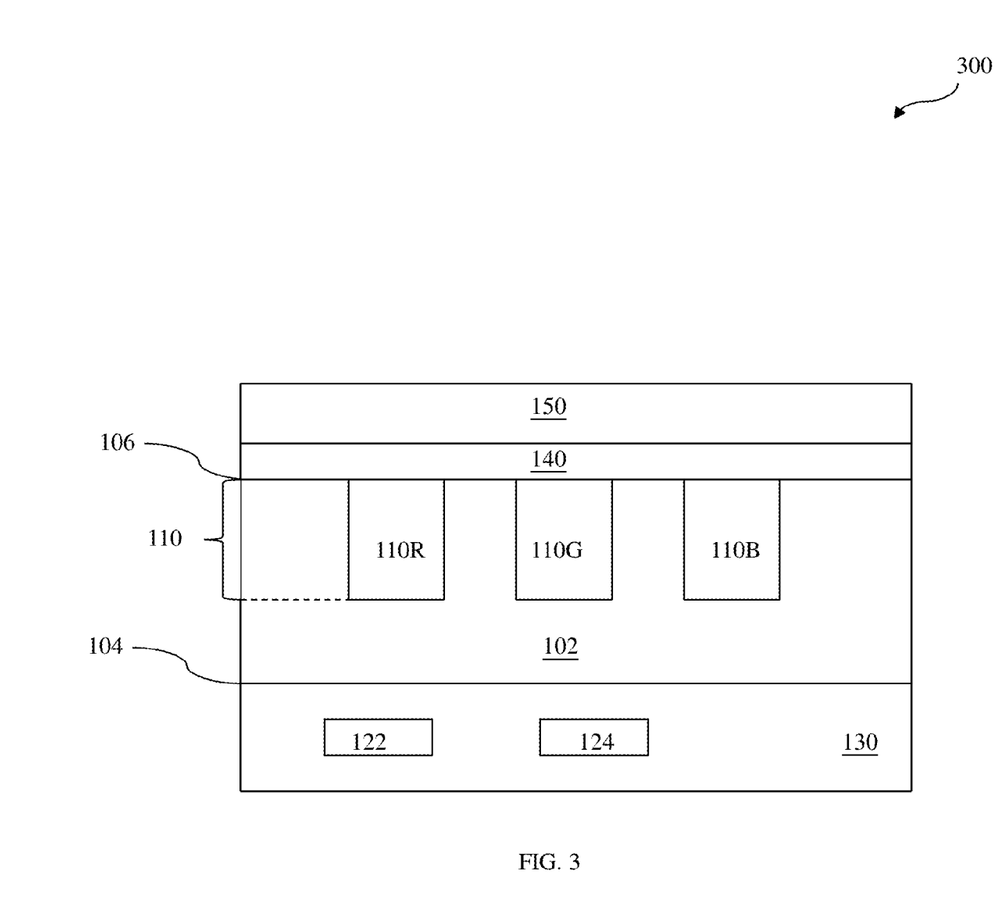
FIGS. 3-11 are diagrammatic sectional side views of an IC device at various fabrication stages according to the method of FIG. 2.

Referring to FIGS. 2 and 3, the method 200 begins at step 202 by providing the IC device precursor 100 and then proceeds to step 204 by depositing a first dielectric layer 140 over the back surface 106 of the substrate 102 and a ridge-forming layer 150 over the first dielectric layer 140. The first dielectric layer 140 may include silicon oxide, silicon oxynitride, or other suitable materials. The -forming layer 150 may include an amorphous carbon layer. The first dielectric layer 140 and the ridge-forming layer 150 may be formed by various methods, including CVD process such as atmospheric pressure CVD (APCVD), low pressure CVD (LPCVD), plasma enhanced CVD (PECVD), or high density plasma CVD (HDP CVD), spin-on coating, and/or other methods known in the art.

Figure 4:
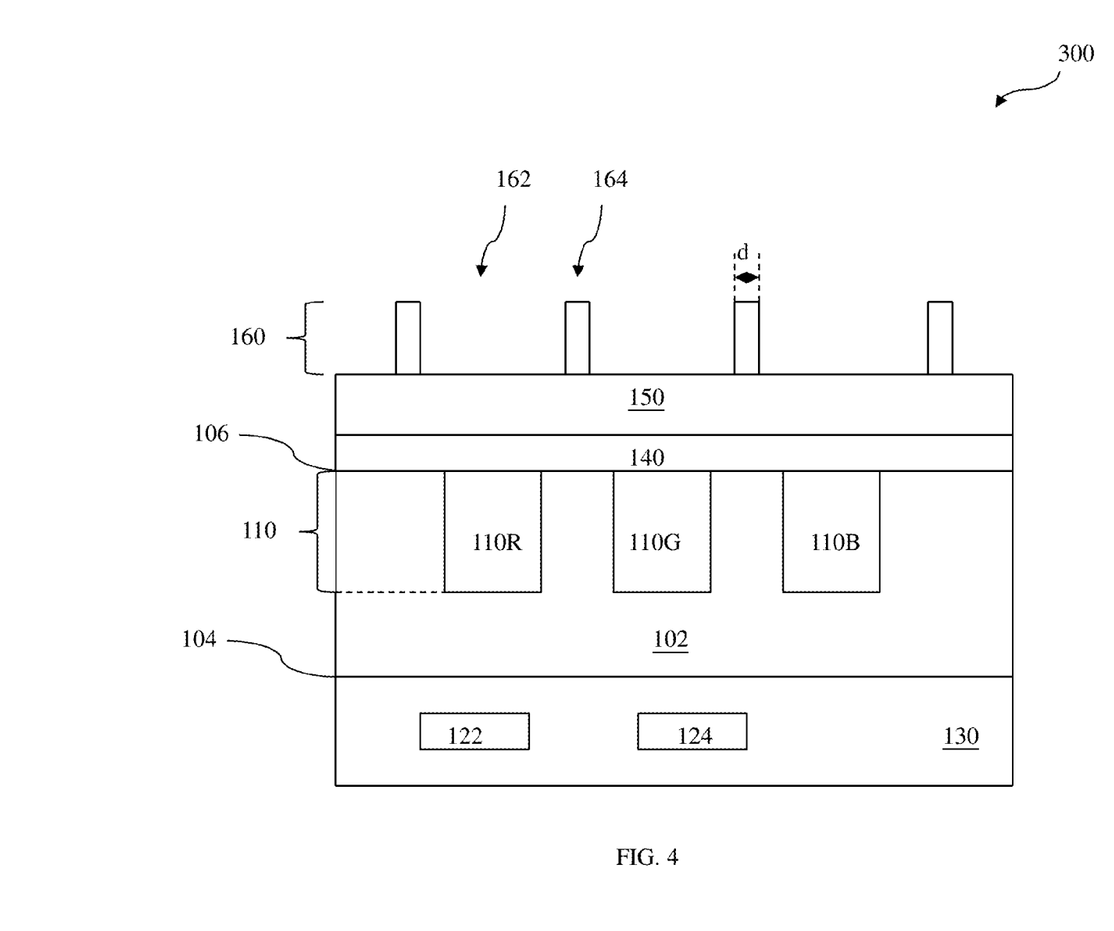

Referring to FIGS. 2 and 4, the method 200 proceeds to step 206 by forming a patterned etching-mask layer 160 over the ridge-forming layer 150. The patterned etching-mask layer 160 has a plurality of openings 162 and a first ridge 164 between two adjacent openings. The opening 162 is aligned to a respective sensor element 110 and the first ridge 164 is aligned to a respective space between two adjacent sensor elements 110. The first ridge 164 is designed to have a width d, which will be a width of a future metal grid. For example, the width d is about 50 nm. In one embodiment, the patterned etching-mask layer 160 includes a patterned photoresist layer. Generally, a patterning process may include photoresist coating (e.g., spin-on coating), exposing, developing the photoresist, other suitable processes, or combinations thereof. Alternatively, the photolithography exposing process is implemented or replaced by other proper methods such as maskless photolithography, electron-beam writing, direct-writing, and/or ion-beam writing.

Figure 5:
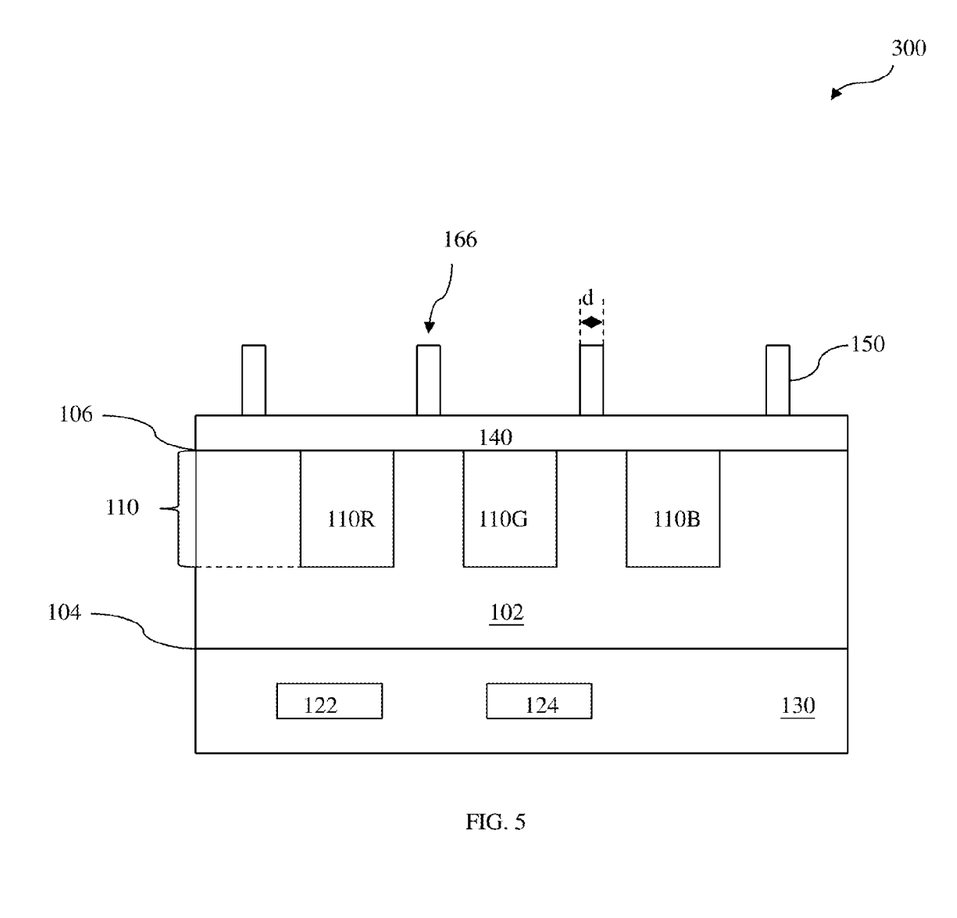

Referring to FIGS. 2 and 5, the method 200 proceeds to step 208 by etching the ridge-forming layer 150 through the opening 162 to form a plurality of second ridges 166. The etch process may include a wet etch, a dry etch, or a combination thereof. For example, a dry etch may etch may include a plasma etching process using a fluorine-based chemistry, such as $CF_4$, $SF_6$, $CH_2F_2$, $CHF_3$, and/or $C_2F_6$. In one embodiment, the second ridge 166 is formed to carry a same width as the width d of the first ridge 164. The patterned etch-mask layer 160 is removed after forming the second ridge 166.

Figure 6:
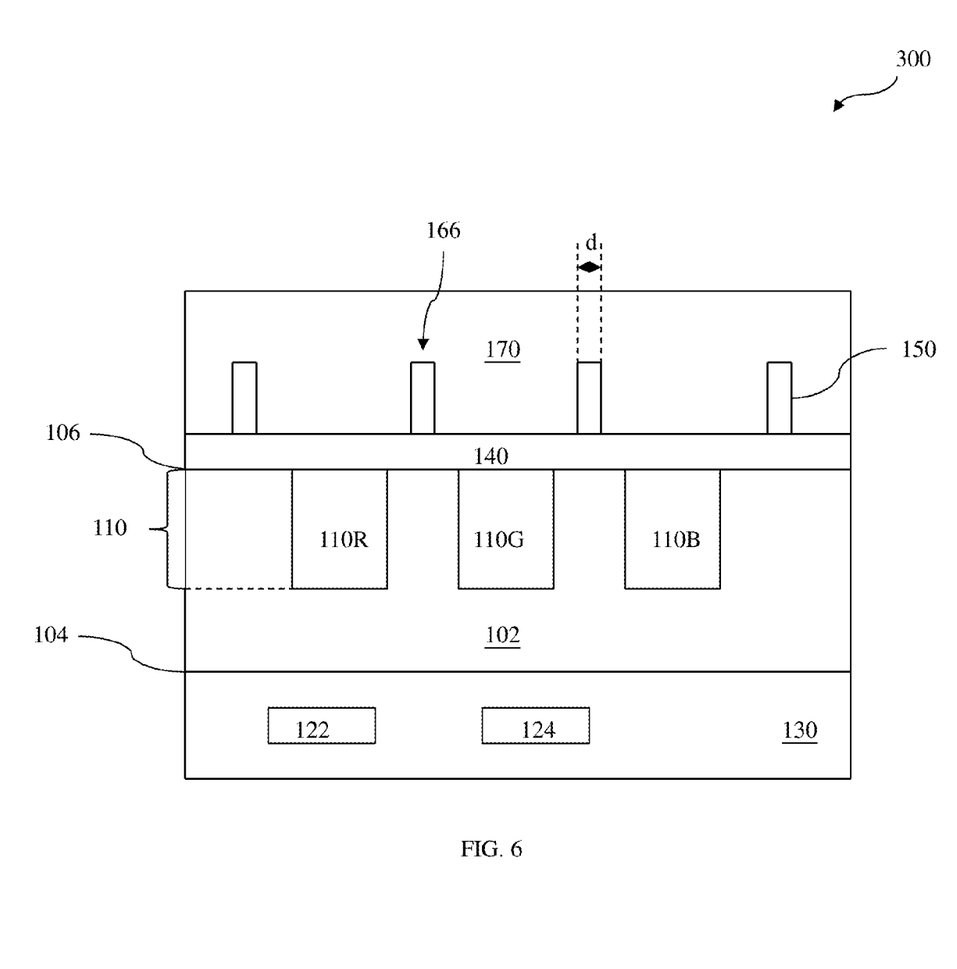

Referring to FIGS. 2 and 6, the method 200 proceeds to step 210 by depositing a second dielectric layer 170 over the first dielectric layer 140, including filling in a spacing between the second ridges 166. The second dielectric layer 170 may include silicon oxide, silicon nitride, silicon oxynitride, or other suitable materials. In the present embodiment, the second dielectric layer 170 includes a material which has an adequate etching selectivity with respect to the second ridge 166 during a subsequent etch process. In one embodiment, the first dielectric layer 140 and the second dielectric layer 170 are a same material. The second dielectric layer 170 may be deposited by various methods, including CVD.

Figure 7:
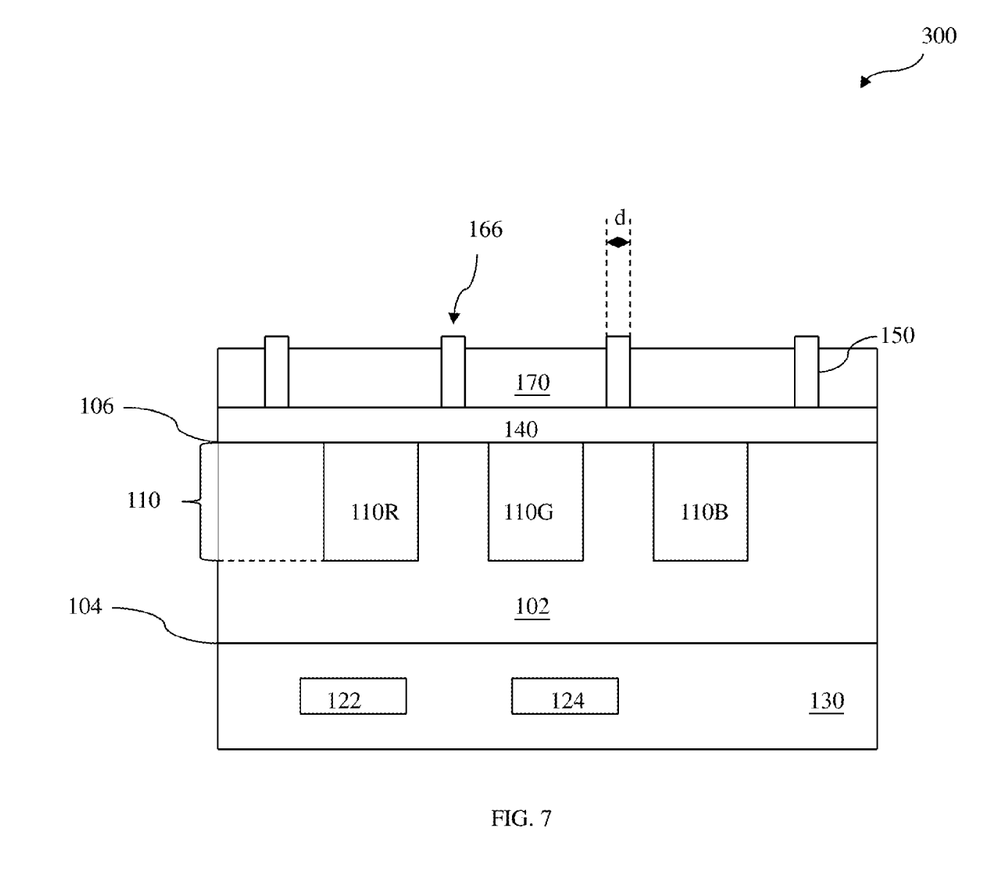

Referring to FIGS. 2 and 7, the method 200 proceeds to step 212 by recessing the second dielectric layer 170 to expose at least a top surface of the second ridge 166. The recessing process may include a selective wet etch, a selective dry etch, or a combination thereof. The recess etches the second dielectric layer 170 selectively but does not substantially etch the second ridge 166. (That is, the etch rate on the second ridge 166 is significantly lower than that of the second dielectric layer 170.).

Figure 8:
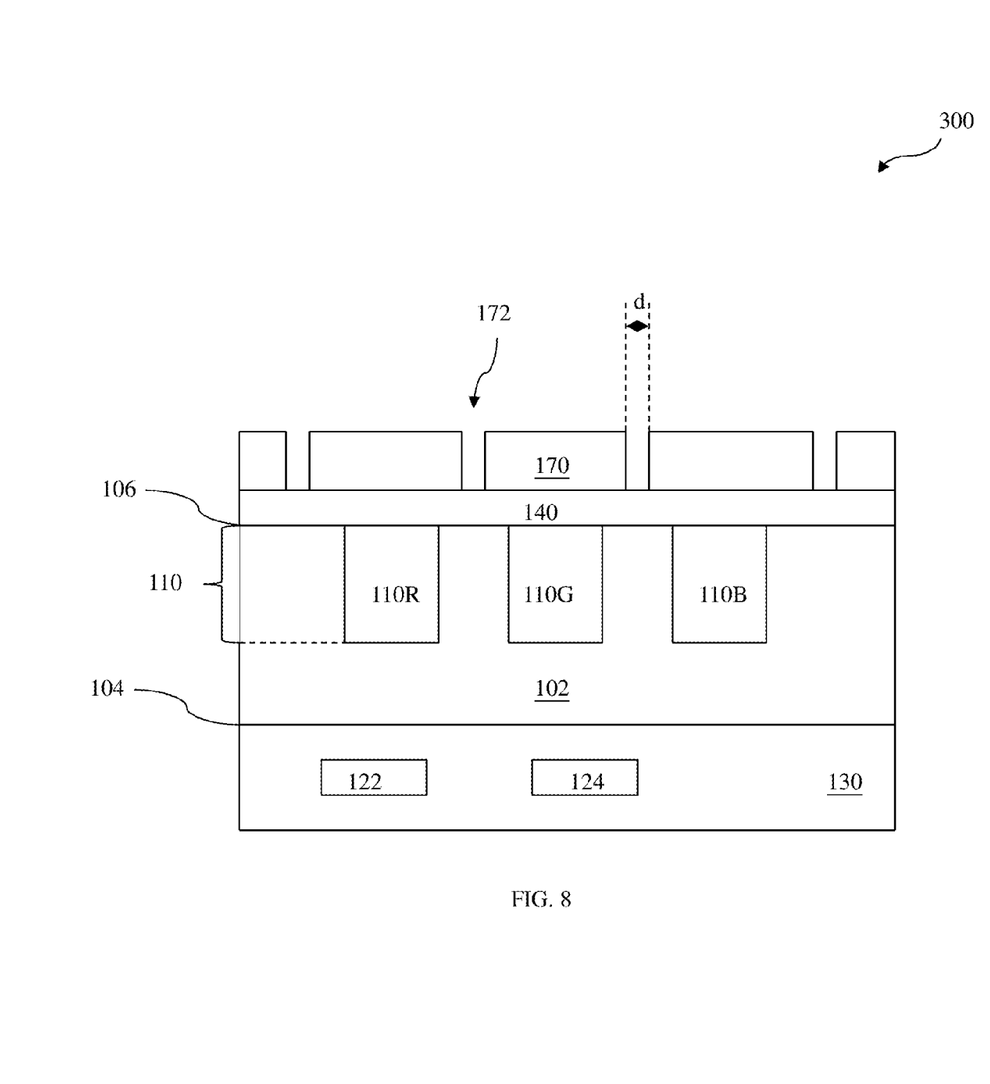

Referring to FIGS. 2 and 8, the method 200 proceeds to step 214 by removing the second ridge 166 to form a trench 172. In one embodiment, the second ridge 166 is removed by a selective etch, which selectively etches the second ridge 166 but does not substantially etch the second dielectric layer 170 and the first dielectric layer 140. The selective etch may include a wet etch, a dry etch, or a combination thereof. As an example, the amorphous carbon ridge 166 is removed by an oxygen plasma etch. By using the selective etch, the trench 172 is formed with a same width as the width d.

Figure 9A:
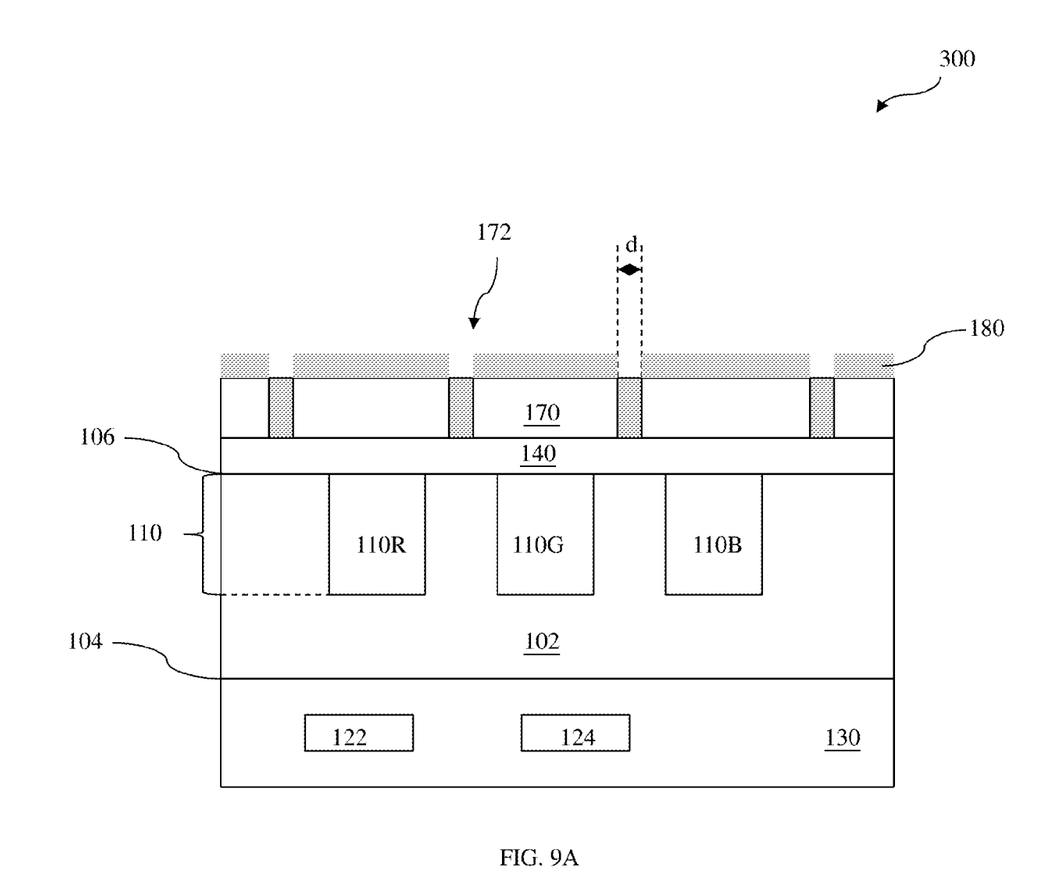
Figure 9B:
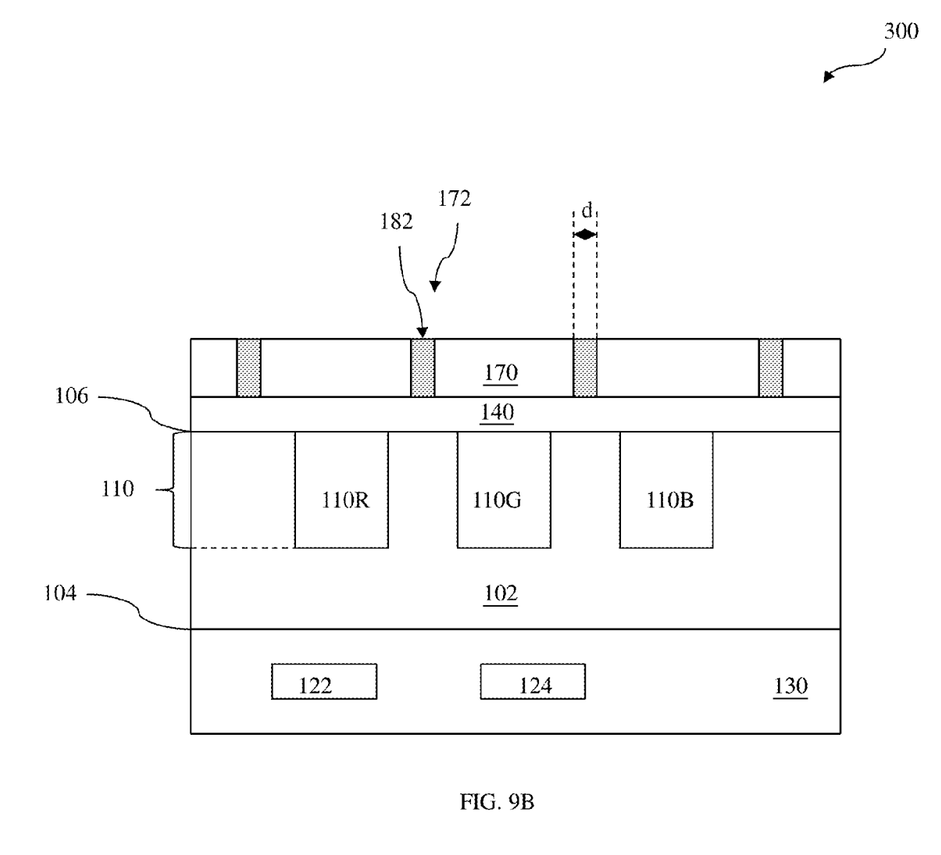

Referring to FIGS. 2 and 9A-9B, the method 200 proceeds to step 216 by filling the trench 172 with a metal layer 180 and removing the excessive metal layer 180 above the trench 172 to form a metal grid 182. The metal layer 180 may include copper, copper alloy, such as copper magnesium (CuMn), copper aluminum (CuAl) or copper silicon (CuSi), although other materials, such as tungsten (W), aluminum (Al) could alternatively be utilized. The metal layer 180 may be deposited by any suitable method known in the art such as PVD, sputter, CVD and electroplating. In one embodiment, prior to depositing the metal layer 180, a barrier layer is deposited to prevent diffusion and/or provide material adhesion. The barrier layer may include titanium nitride (TiN), tantalum nitride (TaN), tungsten nitride (WN), titanium silicon nitride (TiSiN) or tantalum silicon nitride (TaSiN).

After filling the trench 172, the excessive metal layer 180 above the trench 172 is removed and the metal grid 182 is formed. Thus, the metal grid 182 is formed with a same width as the width d. In one embodiment, a chemical mechanical polishing (CMP) may be applied to remove the excessive metal layer 180, such as the copper layer or the tungsten layer.

Figure 10A:
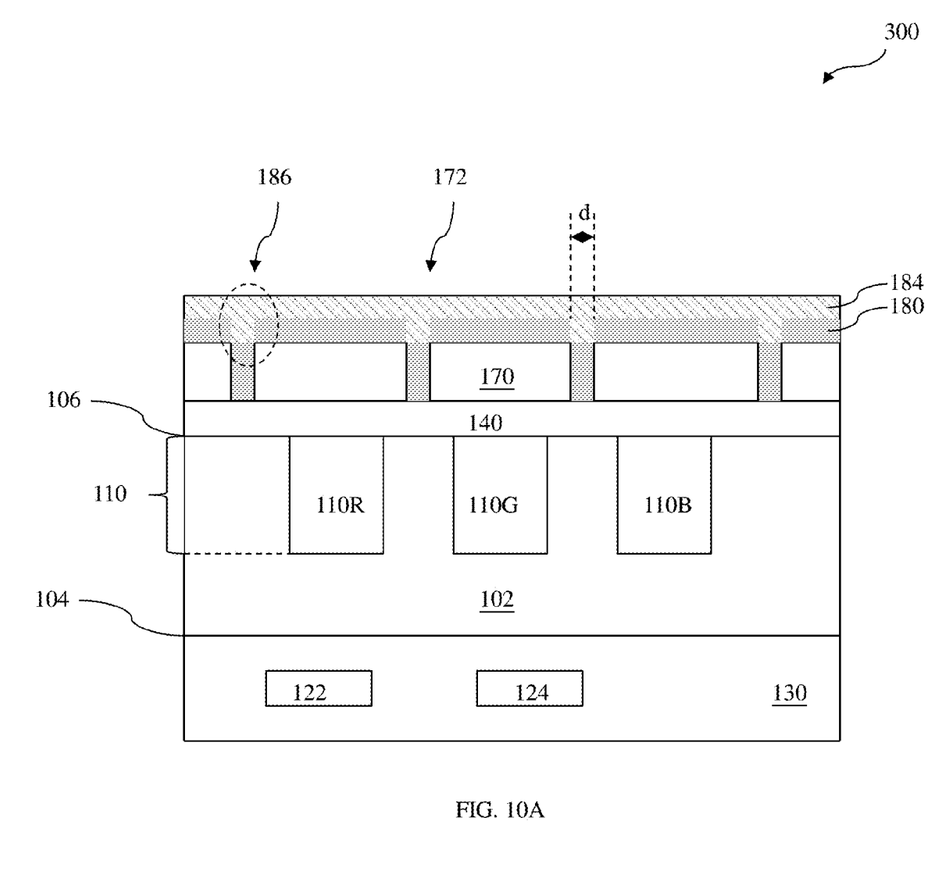
Figure 10B:
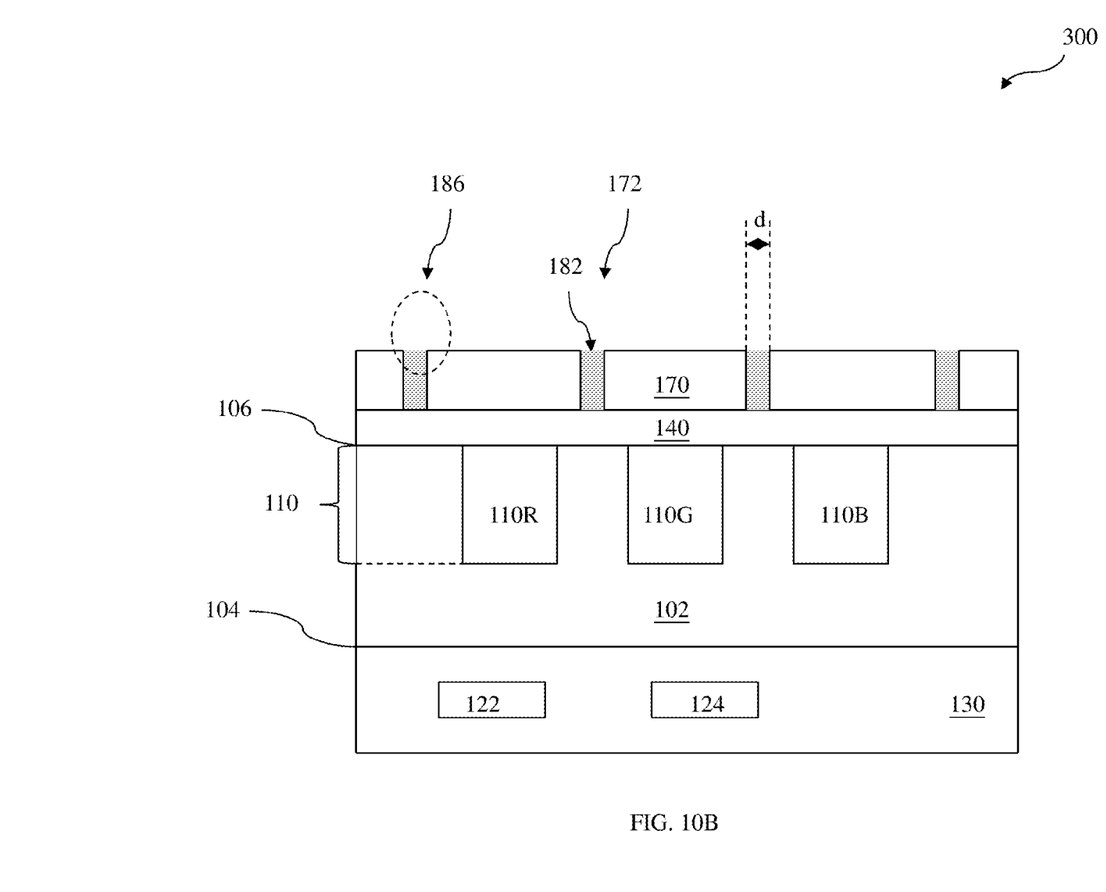

In another embodiment, referring to FIGS. 10A and 10B, a bottom anti-reflection coating (BARC) layer 184 is coated over the metal layer 180, such as an Al layer. The BARC layer 184 may include a nitride material, an organic material, an oxide material and/or the like. A thickness of the BARC layer 184 at a location 186, which is on top of the trench 172, may be thicker than other areas due to the Al layer 180 may have a dip profile at the location 186 when it fills in the trench 172. An etch is then applied to etch the BARC layer 184 and the Al layer 180. The etch may include a wet etch, a dry etch, or a combination thereof. The etch is controlled to remove the excessive Al layer 180 above the trench 172 while the Al layer 180 filled in the trench 172 is protected by the BARC layer 184 with a thicker thickness in the location of 186. Thus, the remaining Al layer 180 in the trench 172 forms the metal grid 182 with a same width as the width d.

Additional steps can be provided before, during, and after the method 200, and some of the steps described can be replaced or eliminated for other embodiments of the method. For example, a third dielectric layer 188 is deposited over the second dielectric layer 170 and the metal grid 182. The third dielectric layer is similar in many respects to the second dielectric layer 170 discussed above in association with FIG. 6.

The IC device 300 may also undergo processing to form various features and regions known in the art. For example, referring to FIG. 11, color filters 190 and microlenses 195 over the back surface 106 of the substrate 102. In some embodiments, each of the color filters 190 aligns with the respective light sensing regions 110R, 110G, and 110B.

Figure 11:
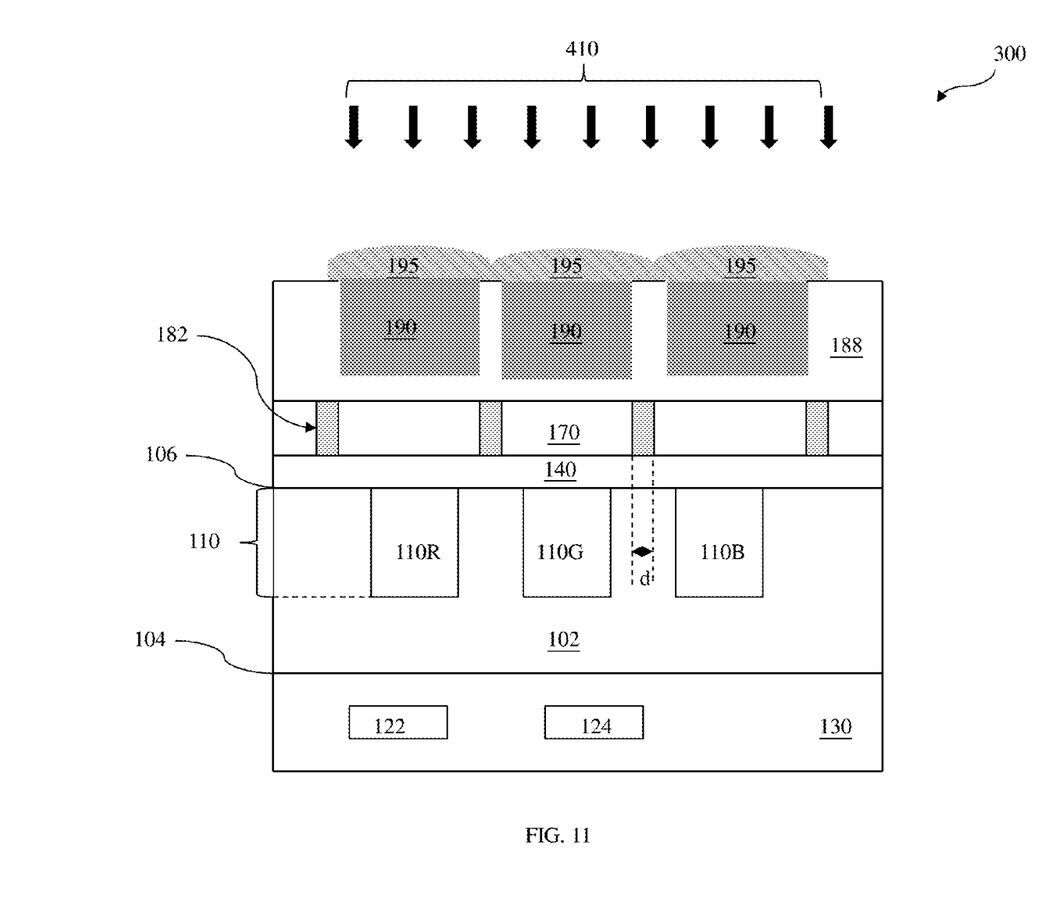

The color filters 190 are designed so that each filters through light of a predetermined wavelength. For example, the color filter 190 aligned with the light sensing region 110R may be configured to filter through visible light of a red wavelength to the light sensing region 110R, the color filter 190 aligned with the light sensing region 110G may be configured to filter through visible light of a green wavelength to the light sensing region 110G, or the color filter 190 aligned with the light sensing region 110B may be configured to filter through visible light of a blue wavelength to the light sensing region 110B. The color filters 190 include any suitable material. In an example, the color filters 190 include a dye-based (or pigment-based) polymer for filtering out a specific frequency band (for example, a desired wavelength of light). Alternatively, the color filters 190 could include a resin or other organic-based material having color pigments.

The microlenses 195, disposed over the back surface 106 of the substrate 102, align with respective light sensing regions 110A, 110G, and 110B of the sensor elements 110. In some embodiments, the lenses 195 are disposed over the color filters 190. The microlenses 195 may be in various positional arrangements with the sensor elements 110 and color filters 190, such that the microlens 195 focuses an incoming incident radiation on the respective light sensing regions 110R, 110G, and 110B of the sensor elements 110. The microlenses 195 include a suitable material, and may have a variety of shapes and sizes depending on an index of refraction of the material used for the microlens and/or a distance between the microlens and sensor elements 110. Alternatively, the position of the color filters 190 and microlens layer 195 may be reversed, such that the microlenses 195 are disposed between the back surface 106 of the substrate 102 and color filters 190. The present disclosure also contemplates the integrated circuit device 300 having a color filter layer disposed between microlens.

Referring also to FIG. 11, in operation, the IC device 300 is designed to receive a radiation 410 traveling towards the back surface 106 of the substrate 102. In the depicted embodiment, the incident radiation 410 is visual light. Alternatively, the radiation 410 could be infrared (IR), ultraviolet (UV), X-ray, microwave, other suitable radiation type, or combinations thereof. The microlenses 195 direct the incident radiation 410 to the respective color filters 190. The light then passes through the color filters 190 to a corresponding sensor element 110, specifically to respective light sensing regions 110R, 110G, and 110B. Light passing through to the color filters 190 and sensor elements 110 may be maximized since the light is not obstructed by various device features (for example, gate electrodes) and/or metal features (for example, the conductive features 122 and 134 of the MLI features) overlying the front surface 104 of the substrate 102. The desired wavelengths of light (for example, red, green, and blue light) are more efficiently allowed to pass through to the respective light sensing regions 110R, 110G, and 110B of the sensor elements 110. When exposed to the light, the light sensing regions 110R, 110G, and 110B of the sensor elements 110 produce and accumulate (collect) electrons, which may be converted to voltage signals.

Based on the above, the present disclosure offers methods for fabricating metal grid for an IC device. Instead of using lithography process to define a width of the metal grid, the method employs using a ridge to define the width of the metal grid involving with a selective etch. The method provides a feasible way to extend a critical dimension of the metal grid to a further generation.

The present disclosure provides many different embodiments of fabricating an IC device that provide one or more improvements over the prior art. In one embodiment, a method for fabricating an IC device includes providing a device precursor. The device precursor includes a substrate having a front surface and a back surface and a plurality of sensor elements disposed at the front surface of the substrate. Each of the plurality of sensor elements is operable to sense radiation projected towards the back surface of the substrate. The method also includes depositing a first dielectric layer over the back surface of the substrate, forming a ridge over the first dielectric layer. The ridge aligns to a space between two adjacent sensor elements. The method also includes depositing a second dielectric layer over the first dielectric layer, including filling in a space between two adjacent ridges. The method also includes removing the ridge to form a trench in the second dielectric layer and forming a metal grid in the trench.

In another embodiment, a method for fabricating an IC device includes providing a device precursor. The device precursor includes a substrate having a front surface and a back surface and a plurality of sensor elements disposed at the front surface of the substrate. Each of the plurality of sensor elements is operable to sense radiation projected towards the back surface of the substrate. The method also includes depositing a first dielectric layer over the back surface of the substrate, depositing a ridge-forming layer over the first dielectric layer, forming a patterned photoresist layer over the ridge-forming layer, etching the ridge-forming layer through the patterned photoresist layer to form a plurality of ridges, depositing a second dielectric layer over the first dielectric layer, including filling in a space between ridges, recessing the second dielectric layer to expose a top surface of the ridge, removing the ridge to form a trench in the second dielectric layer, filling the trench with a metal layer and removing excessive metal layer to form a metal grid in the trench.

In yet another embodiment, a method for fabricating an IC device includes providing a device precursor. The device precursor includes a substrate having a front surface and a back surface and a plurality of sensor elements disposed at the front surface of the substrate. Each of the plurality of sensor elements being operable to sense radiation projected towards the back surface of the substrate. The method also includes depositing a first dielectric layer over the back surface of the substrate, depositing a amorphous carbon layer over the first dielectric layer, forming a patterned photoresist layer over the amorphous carbon layer. The patterned photoresist has openings aligning to respective sensor element and a photoresist ridge between two adjacent openings. The method also includes etching the amorphous carbon layer through the openings to form a plurality of ridges. The ridge has a same width as the photoresist ridge. The method also includes depositing a second dielectric layer over the first dielectric layer, including filling in a space between ridges, recessing the second dielectric layer to expose at least a top surface of the ridge, removing the ridge to form a trench in the second dielectric layer. The trench has a same width as the ridge. The method also includes filling the trench with a metal layer, removing excessive metal layer above the trench to form a metal grid in the trench and forming a color filter and a microlens over the second dielectric layer and the metal grid.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A method for fabricating an integrated circuit device, the method comprising:
  providing a device precursor, including:
    a substrate having a front surface and a back surface; and
    a plurality of sensor elements disposed at the front surface of the substrate, each of the plurality of sensor elements being operable to sense radiation projected towards the back surface of the substrate;

depositing a first dielectric layer over the back surface of the substrate;

forming a ridge over the first dielectric layer, wherein the ridge aligns to a space between two adjacent sensor elements;

depositing a second dielectric layer over the first dielectric layer, including filling in a space between two adjacent ridges;

removing the ridge to form a trench in the second dielectric layer; and forming a metal grid in the trench.

2. The method of claim 1, wherein the forming the ridge includes:

depositing a ridge-forming layer over the first dielectric layer;

forming a patterned etching-mask layer over the ridge-forming layer, wherein the patterned etching-mask layer has an opening aligning to a respective sensor element and an etching-mask ridge between two adjacent openings; and etching the ridge-forming layer through the opening of the patterned etching-mask layer.

3. The method of claim 2, wherein the ridge-forming layer includes amorphous carbon layer deposited by chemical vapor deposition (CVD).

4. The method of claim 2, wherein the ridge is formed with a same width as the etching-mask ridge.

5. The method of claim 1, wherein forming the trench includes:

recessing the second dielectric layer by a selective etch to expose a top surface of the ridge, which does not substantially etch the ridge; and removing the ridge by a selective etch, which does not substantially etch the second dielectric layer.

6. The method of claim 5, wherein the trench is formed with a same width as the width of the ridge.

7. The method of claim 1, wherein forming the metal grid includes:

filling in the trench with a metal layer; and applying a chemical mechanical polishing (CMP) to remove the excessive metal layer.

8. The method of claim 1, wherein forming the metal grid includes:

filling in the trench with a metal layer;

coating a bottom anti-reflection coating (BARC) layer over the metal layer; and etching the BARC layer and the excessive metal layer.

9. The method of claim 1, wherein the metal grid is formed with a same width of the width of the trench.

10. The method of claim 1, further comprising:

depositing a third dielectric layer over the second dielectric layer and the metal grid; and forming a color filter and a microlens over the third dielectric layer.

11. A method for fabricating an integrated circuit device, the method comprising:

providing a device precursor, including:
a substrate having a front surface and a back surface; and
a plurality of sensor elements disposed at the front surface of the substrate, each of the plurality of sensor elements being operable to sense radiation projected towards the back surface of the substrate;

depositing a first dielectric layer over the back surface of the substrate;

depositing a ridge-forming layer over the first dielectric layer;

forming a patterned photoresist layer over the ridge-forming layer;

etching the ridge-forming layer through the patterned photoresist layer to form a plurality of ridges;

depositing a second dielectric layer over the first dielectric layer, including filling in a space between ridges;

recessing the second dielectric layer to expose a top surface of the ridge;

removing the ridges to form trenches in the second dielectric layer;

filling the trenches with a metal layer; and removing excessive metal layer to form a metal grid in the trench.

12. The method of claim 11, wherein the ridge-forming layer includes amorphous carbon layer deposited by chemical vapor deposition (CVD).

13. The method of claim 11, wherein the patterned photoresist layer is formed with openings aligning to respective sensor element and a photoresist ridge between two adjacent openings.

14. The method of claim 13, wherein the ridges are formed with a same width as a width of the photoresist ridge.

15. The method of claim 11, wherein the ridges are removed by a selective etch, which does not substantially etch the second dielectric layer.

16. The method of claim 15, wherein the trenches are formed with a same width as the ridges.

17. The method of claim 11, wherein the metal grid is formed with a same width as the width of the trenches.

18. The method of claim 11, further comprising:

depositing a third dielectric layer over the second dielectric layer and the metal grid; and forming a color filter and a microlens over the third dielectric layer.

19. A method for fabricating an integrated circuit device, the method comprising:

providing a device precursor, including:
a substrate having a front surface and a back surface; and
a plurality of sensor elements disposed at the front surface of the substrate, each of the plurality of sensor elements being operable to sense radiation projected towards the back surface of the substrate;

depositing a first dielectric layer over the back surface of the substrate;

depositing a amorphous carbon layer over the first dielectric layer;

forming a patterned photoresist layer over the amorphous carbon layer, wherein the patterned photoresist has openings aligning to respective sensor element and a photoresist ridge between two adjacent openings;

etching the amorphous carbon layer through the openings to form a plurality of ridges, wherein the ridge has a same width as the photoresist ridge;

depositing a second dielectric layer over the first dielectric layer, including filling in a space between ridges;

recessing the second dielectric layer to expose at least a top surface of the ridges;

removing the ridges to form a trench in the second dielectric layer, wherein the trench has a same width as the ridge;

filling the trench with a metal layer;

removing excessive metal layer above the trench to form a metal grid in the trench; and forming a color filter and a microlens over the second dielectric layer and the metal grid.

20. The method of claim 19, wherein the metal grid is formed with a same width as the width of the trench.

\* \* \* \* \*